(12) United States Patent
Choi

(10) Patent No.: US 6,556,003 B2
(45) Date of Patent: Apr. 29, 2003

(54) COMPUTER MULTIMETER

(76) Inventor: Sang Joon Choi, 2425 W. 183RD St., Homewood, IL (US) 60430

( * ) Notice: Subject to any disclaimer, the term of this patent is extended or adjusted under 35 U.S.C. 154(b) by 134 days.

(21) Appl. No.: 09/811,545

(22) Filed: Mar. 20, 2001

(65) Prior Publication Data

US 2002/0135352 A1 Sep. 26, 2002

(51) Int. Cl.[7] .......................... G01R 17/06; G01R 1/00
(52) U.S. Cl. ...................................... 324/99 D; 324/110
(58) Field of Search ............................ 324/99 D, 110, 324/115, 116; 702/66, 67, 76

(56) References Cited

U.S. PATENT DOCUMENTS

| | | | | |
|---|---|---|---|---|
| 4,520,310 A | * | 5/1985 | Kelly et al. ................. | 324/115 |
| 4,608,657 A | * | 8/1986 | Manome et al. ............ | 324/601 |
| 4,926,174 A | * | 5/1990 | Fiori, Jr. ................... | 324/99 D |
| 5,115,407 A | * | 5/1992 | Bird et al. .................. | 324/73.1 |
| 5,142,221 A | * | 8/1992 | Meldrum et al. ........... | 324/115 |
| 5,157,400 A | * | 10/1992 | Bang ......................... | 341/166 |
| 5,373,410 A | * | 12/1994 | Schreiber et al. ........... | 361/56 |
| 5,396,168 A | * | 3/1995 | Heep et al. ................. | 324/99 D |
| 5,907,102 A | * | 5/1999 | Hilton et al. ................ | 73/777 |
| 5,963,886 A | * | 10/1999 | Candy et al. ................ | 702/61 |
| 6,043,640 A | * | 3/2000 | Lauby et al. ............... | 324/127 |
| 6,043,641 A | * | 3/2000 | Singer et al. ............... | 324/127 |
| 6,098,095 A | * | 8/2000 | Nelson et al. .............. | 709/208 |
| 6,279,131 B1 | * | 8/2001 | Archambeau et al. ...... | 714/737 |

* cited by examiner

Primary Examiner—Kamand Cuneo
Assistant Examiner—Jermele Hollington

(57) ABSTRACT

With added circuits and the computer's existing internal circuits and devices, a PC can function as a multimeter for those users who are testing, designing or analyzing an electronic device, which requires the features of a computer and a multimeter. This invention provides much convenience to the user and will reduce or eliminate the cumbersome handling of two pieces of equipment on the same workbench. The PC multimeter utilizes some of computer's existing devices, such as output devices, input devices, microprocessor and memory, also includes additional multimeter specific circuits assembled on a PCI or ISA I/O board which is installed in the PCI or ISA expansion slot inside the computer. Two test leads are the only elements connected to the I/O board and extruding outside of the computer.

8 Claims, 2 Drawing Sheets

COMPUTER MULTIMETER

BACKGROUND OF THE INVENTION

There are many handheld multimeters, which can be interfaced with a computer. However, this arrangement uses two separate apparatus, a computer system and a voltmeter. Therefore, a user should carry a multimeter to do the test, which requires a displaying screen and an electrical measuring device. The selection of a function is controlled from the handheld multimeter and the measured results are displayed on the computer screen. The handheld apparatus should be connected to the rear side of the computer every time it is used. The multimeter interfaced with computers are using serial communication cables. The serial data communications are very slow in transferring data from one device to the other. A parallel data cable can be used, however, this will be costly and bulky.

The aforementioned facts are telling that the multimeters of the prior art are very inconvenient and inefficient to the user in comparison to the computer multimeter of this invention. All functions can be accomplished with only a handheld multimeter. However, the handheld multimeter provides very limited feasibility such as displaying just the measured value. It cannot display a meaningful message nor can it draw an eye-catching illustration.

If a versatile and multi-faceted multimeter is needed, it can be made, but the cost will be expensive. It is the recent trend that engineers, designers, and technicians are using a computer as much as possible for their work because the computer provides unlimited capabilites. The above-listed facts have raised a strong incentive to come up with a new invention of the computer multimeter. This invention is named a PC Multimeter, or Computer Multimeter. The PC Multimeter comprises combination of existing computer circuits and multimeter-specific-circuits.

FIELD OF THE INVENTION

A method for making computer multimeter by adding multimeter circuits to the existing computer resources in a computer system. In general, a computer can perform many different functions. This invention adds measuring functions to a computer system.

SUMMARY OF THE INVENTION

The PC Multimeter comprises input devices such as a keyboard, or disk drives, output devices such as a monitor screen, and internal component devices such as a microprocessor or memory. The above described devices are inherent in the computer. Said multimeter also comprises PPI, buffer/transceiver, A/D converter, timer/counter, and analog measuring circuits. This invention utilizes the existing computer circuitry and devices as part of the PC multimeter as listed above. The other part includes multimeter-specific-circuitry assembled on an I/O expansion board. The I/O board is mounted in an I/O expansion slot inside the computer. Except input/output devices, all circuits and devices are enclosed inside the computer. The only elements of the PC Multimeter extruding outside of the computer are two test leads, which connect the PC Multimeter to the device being tested. Being located inside the computer, the added multimeter-specific-circuits become part of the computer, providing expanded multimeter functions to the computer. The functions of the PC Multimeter are very versatile, and its displaying capability is unlimited, for example, a numerical value, a word message, an illustration, a table, or a graphical representation for a measured magnitude.

This invention provides the ability to have a very fine resolution by adding multiplier circuits for a very small magnitude signal. Since additional multimeter-specific-circuits are added to the existing computer circuits, the buffer and transceiver circuits are inserted between them. The circuits provide high impedance between existing computer circuits and the added circuits preventing the latter from shorting out or loading down the former circuits. The subject multimeter includes the function of a frequency counter in addition to the most common voltmeter, current meter, ohmmeter, and waveform meter. The edge shaping circuit converts any incoming periodic signal into a rectangular wave which is easier to trigger the frequency counter. The counter counts the input frequency and couples the measured result to the microprocessor through the interfacing circuits, which includes buffer/transceiver and programmable peripheral interface circuits.

For the analog measuring circuits, a key from the keyboard initiates a function and the microprocessor controls the pertinent switch. The appropriate range is automatically selected by the microprocessor under a program control. Five function switches are utilized, one for each function. Those switches are high current and high voltage electronic switches. The range switches are typical bilateral electronic switches. Even though the computer multimeter of this invention includes only five functions, any number of functions can be added to it, because today's microprocessor equipped within a personal computer has unlimited control capability.

DETAILED DESCRIPTION OF THE INVENTION

A PC Multimeter of This Invention Has the Following Features

Capabilities of calculation, diagnosis, analysis, and displaying of the test result with computer resources such as microprocessor, memory, keyboard and monitor screen.

Figure 1:
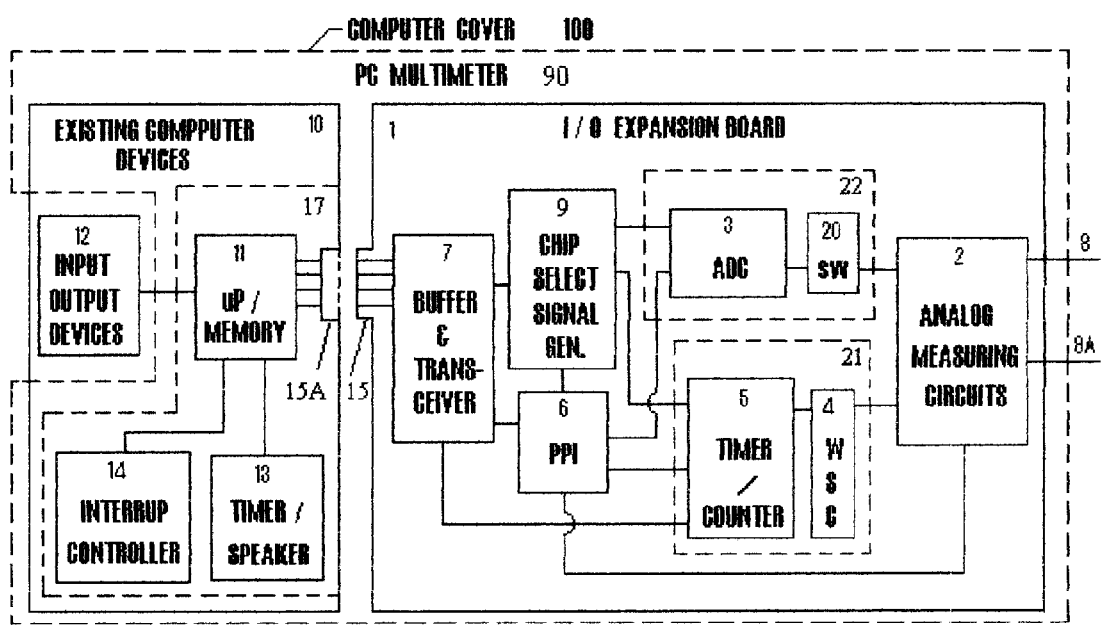
FIG. 1 is a block diagram of the computer multimeter showing each side of the I/O expansion board, and the existing circuits and device.

FIG. 1 shows a block diagram of the PC multimeter (90), which comprises two sections: existing computer device (10) and I/O expansion board (1). The I/O expansion board (1) includes multimeter specific circuits, of which the connector of signal pins (15) is inserted in an I/O expansion slot (15A) on a motherboard (17) of the computer to provide additional multimeter functions to the existing typical computer functions.

The main functions of the analog measuring circuits means (2) are to select a function and an appropriate range for a specific value to be measured. A data conversion means (22) comprises an ADC converter device (3) and a protection switch (20) which prevents the ADC device from being overloaded. An analog to digital converter (3) receives the measured value by an analog measuring circuit (2) in the form of an analog value, converts the received value into digital value representative of the input analog value and outputs the converted digital value to a microprocessor (11) via PPI (6) and buffer and transceiver (7). If 8 bit ADC chip is used, the range of the output digital value will be 0 to 255. If $V_{REF}$=5 volts, each digital step is equivalent to approximately 20 mV (5/255), and the maximum analog input voltage is 5 volts. The range circuits at the input terminal should be designed for the input voltage not to exceed the maximum allowable voltage. A chip select signal generator (9) decodes the encoded address information coupled from the microprocessor, generates the chip select signals, and send the signal to select a requested device. The functions of the programmable peripheral interface (PPI) circuit (6) interface the data between the microprocessor (11) and multimeter specific circuits (1).

For example, the chip select signal generator (9) receives an address information of an I/O address, either ADC (3), PPI (6), or timer/counter (5), then it selects the specific device, receives data from the microprocessor, and deliver the data to the device selected. PPI 8255 has 3 data ports and one control register. With three data ports, the chip has total 24 bits of data lines. Buffer and transceiver circuits (7) provides high impedance between microprocessor (11) and multimeter circuits (1). The buffer and transceiver circuits (7) prevents the multimeter circuits from shorting out or loading down the microprocessor (11) in case a circuit is shorted in the multimeter specific circuits (1) side. This circuit is very important in the computer multimeter circuits by virtually isolating the two sections, the existing computer resource section (10) and I/O expansion board section (1) in terms of impedance. On the other hand, it couples data, address, and control signals without any loss of the signal fidelity. The two sections are communicating data in parallel, therefore all signal lines should be buffered to protect the internal computer circuits.

A frequency counter (21) which is made of an external timer/counter chip (5) and a waveshaping circuit (20). The timer/counter (5) can be programmed to measure time for one second, and at the end of the time, it will read the frequency stored in a counter (5). A certain timer/counter chip has 3 sections of timer/counter. Each section can be programmed either as a timer or as a counter. A waveshaping circuit (4) reshapes any incoming AC signal to a nicely edged squarewave to better trigger the timer/counter (5).

The following description is pertaining to the existing computer circuits and devices (10). It includes a motherboard (17) and input and output devices (12), and the motherboard comprises a microprocessor and memory (11), interrupt controller (14), and timer/speaker devices (13). The microprocessor (11) receives a function command from an input device (12), controls the associated circuits and devices, manipulates data acquired through the various functions in the multimeter circuits (1), and displays the manipulated results on a output device (12). An input device provides a command value for a specific function to the microprocessor. And a disk drive which is an input or output device (12) may input a command file or a data file to the microprocessor. The memory (11) may store the command file and/or data in it while they are processed. Output devices (12) may include typical computer monitor and disk drives. For this particular application, the computer monitor (12) screen is used to display the measured value or pertinent message on it. This invention takes the advantages utilizing the existing resources (10) in a computer system which gives the powerful means controlling the related functions and ranges, storing data or program, and displaying the measured result rather stylishly on the computer screen (12).

The timer and speaker (13) together can be used as a warning device (13), activated by an interrupt controller (14), which is a very powerful feature in a personal computer system. For example, when applied voltage is higher than the maximum allowed voltages, it may invoke an interrupt service routine which in turn activates the internal timer (13) for a frequency and energize the speaker (13) for a certain tone. If an input current is higher than the maximum allowable value, it will invoke another interrupt service routine which in turn activates the internal timer (13) for another frequency and energizes the speaker (13) for another tone. The connector of signal pins (15) is inserted into the I/O expansion slot (15A) on the motherboard (17) of the computer.

Figure 2:
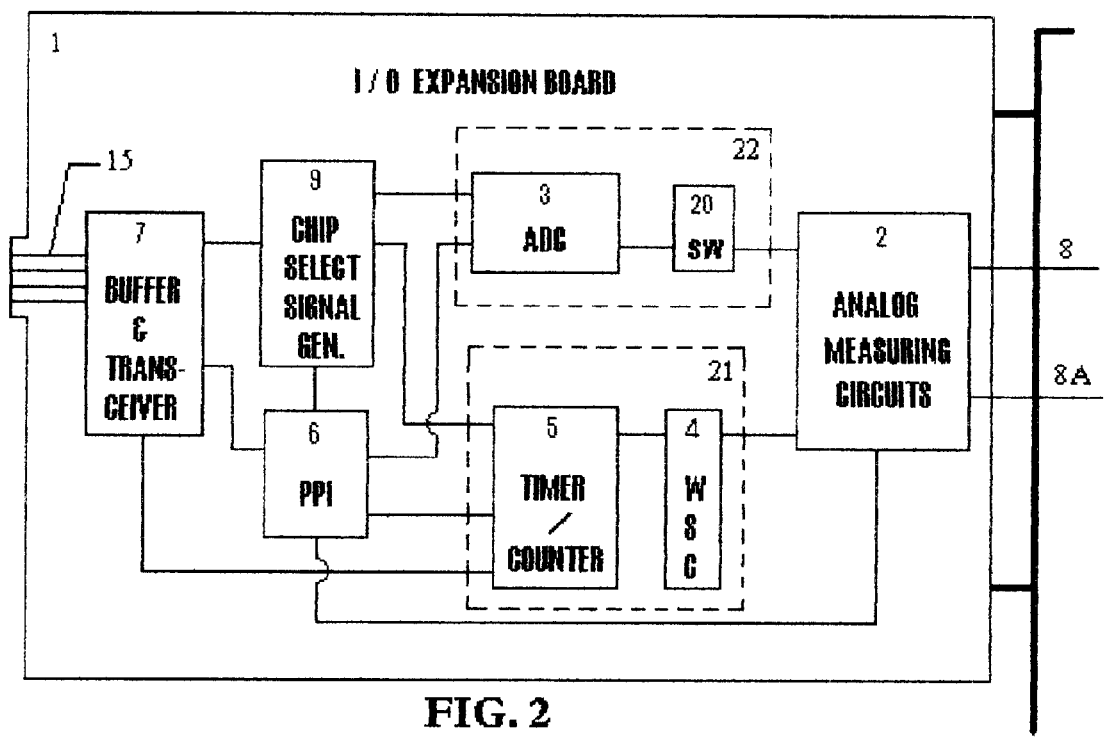
FIG. 2 is block diagram of the I/O expansion board showing the multimeter specific devices and a bracket which is used to mount the board in the expansion slot.

FIG. 2 shows the layout of an I/O expansion board (1) on which the multimeter-specific-circuits are assembled. The I/O board (1) is inserted in the I/O expansion slot (15A) on the motherboard (17) of the computer. It will stay in the computer under normal operation of said multimeter. The I/O expansion board (1) can be either PCI, ISA, or any other type of interfacing architecture board to be suited for the existing I/O expansion slot (15A). The expansion board is also called I/O adapter card.

The analog measuring circuits means (2) receive an analog value from an external device under test through two test leads (8 and 8A) and connects the received signal to either ADC (3) through an ADC protection circuit (20) or to the timer/counter (5) through a waveshaping circuit (4).

The timer/counter device (5) will receive an unknown AC signal and measures the frequency of the incoming signal. The waveshaping circuits (4) comprises either operational amplifier circuits or emitter coupled logic circuits which shapes the incoming signal to a rectangular wave which triggers the timer/counter device (5) at more precise time. The external timer/counter circuits (5) should be programmed to count the frequency of an incoming periodically repetitive AC signals.

Figure 3:
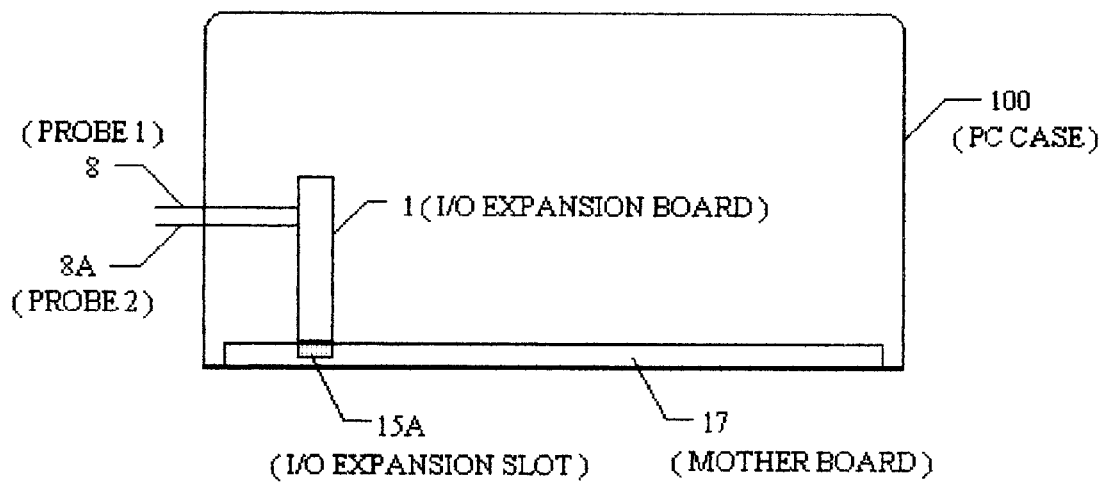
FIG. 3 is block diagram showing the structural layout of a computer case, a motherboard, and an I/O expansion board.

FIG. 3 is a block diagram showing a personal computer case (100) covering a motherboard (17). It also shows how an I/O expansion board (1) is installed in an I/O expansion slot (15A), and 2 probes (8 and 8A) connected to the I/O expansion board and extruding outside of the computer case (100).

What I claim as my invention is:

1. A computer multimeter apparatus embodied inside a personal computer for measuring a magnitude of an electrical value under the control of existing computer resources inherent in the personal computer, wherein said apparatus comprising:
    a) an I/O expansion board, installed in an I/O expansion slot on a motherboard of the computer, which includes multimeter specific circuits means for measuring and processing a measured value of a function, where functions include voltage measurement, current measurement, resistance measurement, and frequency measurement; and
    b) the existing computer resources for manipulating a received data, displaying the manipulated data on an output device, inputting a command for a function from an input device.

2. The computer multimeter of claim 1, wherein said I/O expansion board further comprising:
    a) two or more test leads, wherein one side of each probe is connected to the I/O expansion board inside the personal computer, and the other side is extruding outside of the personal computer as to be able to connect to a device under test;

b) analog measuring circuits means, for selecting a function, setting a range, and measuring a magnitude of a selected function;

c) data conversion means for converting an analog value to a digital value;

d) frequency counter means for measuring an input frequency;

e) a buffering and transceiver means for controlling the direction of data flow, providing high impedance between the personal computer circuits and the circuits on the I/O expansion board, and preventing the I/O board circuits from shorting out or loading down the personal computer circuits;

f) a chip select signal generator for generating a chip select signal which selects a specific I/O device, wherein I/O device comprises ADC, timer/counter, PPI, and analog measuring circuits means; and g) a PPI means for programming data pattern, transferring data, address, and control signals between microprocessor and the circuits contained in the I/O expansion board.

3. The computer multimeter of claim 1, wherein said existing personal computer resources means comprising;

a) a personal computer internal microprocessor for processing data and communicating with the PPI device, memories, and computer inherent input/output devices;

b) a personal computer interrupt controller for applying an interrupt service routine to initiate a desired function;

c) personal computer inherent input/output devices for inputting a function command and displaying a test result;

d) personal computer internal memories for storing programs and data.

4. The computer multimeter of claim 2, wherein said data conversion means comprising:

a) a successive approximation ADC converter for converting an analog value measured by analog measuring means to a digital value with high resolution;

b) a protection switch for protecting the ADC device by controlling a measuring magnitude not to exceed a rated value.

5. The computer multimeter of claim 2, wherein said frequency counter means comprising:

a) a rectangular waveshaping means for converting any incoming periodically repetitive AC signal into a rectangular wave which can trigger the timer/counter device at a more precise time; and b) timer/counter device for counting the frequencies of an incoming signal.

6. The computer multimeter of claim 1, wherein said functions further comprising waveform measurement for a graphical representation of an input.

7. A method for upgrading a personal computer to include multimeter functions, wherein said method comprising steps of:

a) assembling the multimeter specific circuits on an I/O expansion board, and installing the I/O board in an expansion slot on the motherboard inside the personal computer;

b) including all multimeter specific circuits means inside the personal computer case except two or more test leads; and c) extruding the test leads outside of the personal computer.

8. The method for upgrading a personal computer to include multimeter functions according to claim 7, wherein said method further comprising step of:

utilizing the personal computer inherent resources, as part of a computer multimeter, which comprise internal microprocessor for processing and manipulating data, memories for storing data, input/output devices for inputting commands and displaying data, interrupt controller for invoking an interrupt service routine, internal timer/counter and speaker for using as a warning device, and I/O expansion slot for installing an I/O expansion board.

* * * * *